US006716737B2

(12) United States Patent
Plas et al.

(10) Patent No.: US 6,716,737 B2
(45) Date of Patent: Apr. 6, 2004

(54) METHOD OF FORMING A THROUGH-SUBSTRATE INTERCONNECT

(75) Inventors: Hubert Vander Plas, Palo Alto, CA (US); Barry C. Snyder, Bend, OR (US); Ronald A. Hellekson, Eugene, OR (US); Ronnie J. Yenchik, Blodgett, OR (US); Diane Lai, Corvallis, OR (US); Samson Berhane, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/208,363

(22) Filed: Jul. 29, 2002

(65) Prior Publication Data
US 2004/0018712 A1 Jan. 29, 2004

(51) Int. Cl.[7] ............................................. H01L 21/44
(52) U.S. Cl. ....................... 438/612; 438/618; 438/667
(58) Field of Search ................................. 438/612, 618, 438/666, 667

(56) References Cited
U.S. PATENT DOCUMENTS

| | | | |
|---|---|---|---|
| 3,903,427 A | 9/1975 | Pack | |
| 4,309,083 A | 1/1982 | Duchene et al. | |
| 4,348,253 A | 9/1982 | Subbarao et al. | |
| 4,445,978 A | 5/1984 | Whartenby et al. | |
| 4,961,821 A | 10/1990 | Drake et al. | |
| 4,964,212 A | 10/1990 | Deroux-Dauphin et al. | |
| 5,024,966 A | * 6/1991 | Dietrich et al. ................ 438/23 |
| 5,037,782 A | 8/1991 | Nakamura et al. | |
| 5,166,097 A | 11/1992 | Tanielian | |
| 5,425,816 A | 6/1995 | Cavicchi et al. | |
| 5,426,072 A | * 6/1995 | Finnila ........................ 438/107 |
| 5,496,755 A | * 3/1996 | Bayraktaroglu ............. 438/167 |
| 5,599,744 A | 2/1997 | Koh et al. | |
| 5,807,783 A | * 9/1998 | Gaul et al. ................... 438/406 |
| 5,851,894 A | 12/1998 | Ramm | |
| 5,985,521 A | 11/1999 | Hirano et al. | |
| 6,096,635 A | 8/2000 | Mou et al. | |
| 6,110,825 A | 8/2000 | Mastromatteo et al. | |
| 6,143,190 A | 11/2000 | Yagi et al. | |
| 6,197,664 B1 | 3/2001 | Lee et al. | |
| 6,221,769 B1 | 4/2001 | Dhong et al. | |
| 6,352,923 B1 | * 3/2002 | Hsuan et al. ................ 438/667 |
| 6,358,762 B1 | * 3/2002 | Kohno et al. ................. 438/17 |
| 2001/0027002 A1 | 10/2001 | Matsumoto | |

OTHER PUBLICATIONS

Kuhmann et al., "Through Wafer Interconnects and Flip–Chip Bonding: A Toolbox for Advanced Hybrid Technologies for MEMS," pp. 1–8.

* cited by examiner

Primary Examiner—T. N. Quach

(57) ABSTRACT

A method of forming a through-substrate interconnect for a circuit element in a microelectronics device is provided. The device is formed on a substrate having a frontside and a backside, and includes a circuit element formed on the frontside of the substrate connected to a contact pad formed on the backside of the substrate by the through-substrate interconnect. The method includes forming a first interconnect structure extending into the substrate from the frontside of the substrate, at least partially forming the circuit element such that the circuit element is in electrical communication with the first interconnect structure, and forming a second interconnect structure extending into the substrate from the backside of the substrate after forming the first interconnect structure such that the second interconnect structure is in electrical communication with the first interconnect structure.

32 Claims, 8 Drawing Sheets

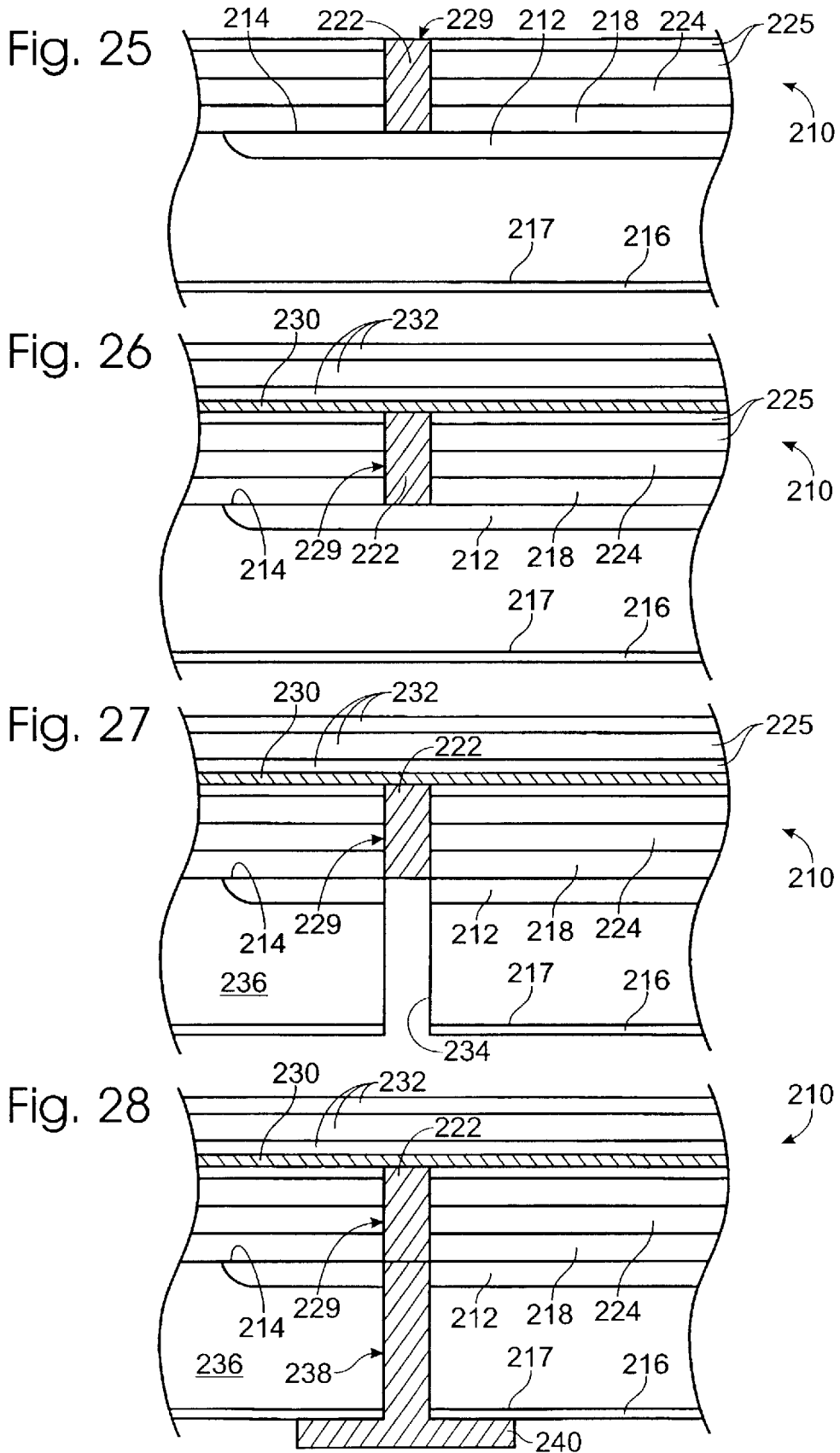

METHOD OF FORMING A THROUGH-SUBSTRATE INTERCONNECT

BACKGROUND OF THE INVENTION

As it becomes possible to fit more and more circuit elements onto a single substrate, a correspondingly larger number of interconnects may need to be fabricated on the substrate to connect the circuit elements to off-substrate circuitry. Conventional interconnects are typically formed on the same side of the substrate as the circuit elements (the "frontside" of the substrate), and terminate at contact pads formed around the perimeter of the frontside of the substrate. With each increase in the number of circuit elements on a single substrate, the contact pads and interconnects typically become more crowded around the perimeter of the substrate. This may lead to reducing the size of the interconnects to squeeze them into the available space. The reduced interconnect size may lead to various problems, such as a high interconnect resistance caused by the small cross-sectional area of the interconnects.

In various specific implementations, the placement of interconnects on the substrate frontside may cause other problems as well. For example, the interconnects that connect the firing mechanisms in an inkjet printhead die to external circuitry are typically formed on the same side of the substrate as the ink nozzles. Thus, these interconnects may be exposed to printing inks during printhead use, which may degrade or damage the interconnects. Furthermore, continued exposure to the inks may lead to the eventual failure of the printhead.

SUMMARY OF THE INVENTION

The present invention provides a method of forming a through-substrate interconnect for a circuit element in a microelectronics device. The device is formed on a substrate having a frontside and a backside, and includes a circuit element formed on the frontside of the substrate connected to a contact pad formed on the backside of the substrate by the through-substrate interconnect. The method includes forming a first interconnect structure extending into the substrate from the frontside of the substrate, at least partially forming the circuit element such that the circuit element is in electrical communication with the first interconnect structure, and forming a second interconnect structure extending into the substrate from the backside of the substrate after forming the first interconnect structure such that the second interconnect structure is in electrical communication with the first interconnect structure.

BRIEF DESCRIPTION OF THE DRAWINGS

FIG. 25 is a sectional view of the substrate of FIG. 20, after etching and filling additional portions of the first trench.

FIG. 26 is a sectional view of the substrate of FIG. 20, after forming an electrical contact layer over the first trench.

FIG. 27 is a sectional view of the substrate of FIG. 20, after forming a second trench in the substrate from the backside of the substrate.

FIG. 28 is a sectional view of the substrate of FIG. 20, after depositing an electrically conductive material in the second trench.

DETAILED DESCRIPTION

Embodiments of the present invention place the contact pads on the back of the substrate and form interconnects that extend through the substrate to the contact pads. In this manner, a greater number of contacts may be formed on a single substrate without crowding problems. Furthermore, in the specific implementation of a die for an inkjet printhead, routing the interconnects through the substrate protects the interconnects from degradation through exposure to printing inks. This may increase the lifetime of a printhead utilizing such a die.

Through-substrate interconnects may also have other potential uses besides the connection of a circuit element on the front of a substrate to a contact pad on the back of the substrate. For example, the interconnects may also be used to connect circuit elements formed on the back of a substrate to circuit elements formed on the front of the substrate, and thus may allow circuit elements to be formed on both sides of a substrate.

Various methods of forming through-substrate interconnects have been proposed in the past. For example, some past methods involve the formation of through-holes, or holes that extend all the way through the substrate, as a step in the through-interconnect manufacturing process. However, this may interfere with the use of the substrate in some processing machines used in later processing steps. This is because some processing machines use a vacuum to hold a substrate during transport through or-between processing stages. The presence of through-holes may allow air (or a processing gas) to pass through a substrate, thus preventing the formation of a vacuum against the substrate. Thus, the through-holes may make the substrates difficult to transport or hold during downstream processing steps. In contrast, embodiments disclosed herein provide for the formation of the through-interconnect without the formation of a through hole, and thereby allow substrates processed via the disclosed methods to be used with these processing machines.

Figure 1:
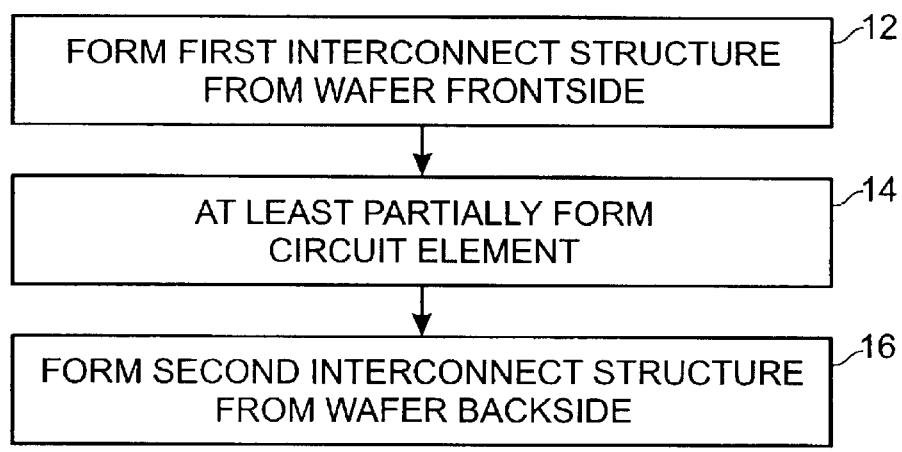
FIG. 1 is a flow diagram of a method of forming a through-substrate interconnect according to a first embodiment of the present invention.

FIG. 1 shows generally at 10 a first method of forming a through-substrate interconnect for a circuit element. The method first includes forming, at 12, a first interconnect structure that extends into the substrate from the frontside of the substrate. After the first interconnect structure is formed, a circuit element is at least partially formed at 14. The circuit element is formed in such a manner as to be in electrical communication with the first interconnect structure so that current can pass from the first interconnect structure to the circuit element. Method 10 next includes forming a second interconnect structure at 16. The second interconnect structure extends into the substrate from the backside of the substrate, and is formed in such a manner as to be in electrical communication with the first interconnect structure. Thus, the first and second interconnect structures together define an electrically conductive pathway that extends through the substrate to connect with the circuit element. Furthermore, the second interconnect structure is typically connected to a contact pad formed on the backside of the substrate, which is configured to be connected to a complementary connector on the circuit packaging. This allows the circuit to be easily connected to off-substrate circuitry.

The general steps of method 10 may be performed in any of a number of different ways. A first implementation of method 10 is illustrated by FIGS. 2–6, which show cross-sectional views of a substrate 20 taken after performing selected steps of the implementation.

Figure 2:
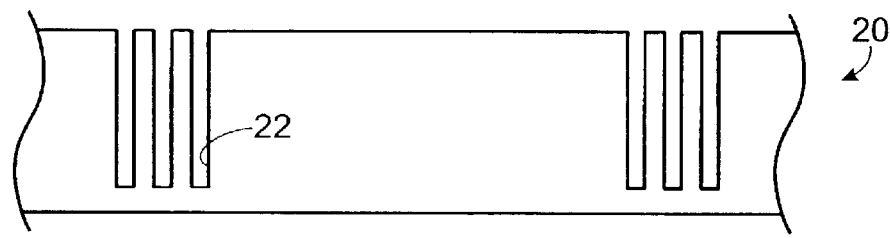
FIG. 2 is a sectional view of a substrate after forming a plurality of trenches partially through the substrate from the frontside of the substrate in accordance with a first implementation of the embodiment of FIG. 1.

Referring first to FIG. 2, a series of trenches 22, corresponding to the first interconnect structure of method 10, are formed in substrate 20 at a point early in the processing of the substrate. Trenches 22 are configured to be opened from the backside at a later processing step and then coated or filled with an electrically conductive material to form the through-substrate interconnect. Waiting until a later processing step to deposit the electrically conductive material in the trenches allows higher temperature materials processing techniques to be used to form circuit elements downstream of the trench-forming step without harming other structures formed on the surface of substrate 20.

Trenches 22 may extend any desired depth from the frontside of substrate into the substrate. The distance that trenches 22 extend into substrate 20 may depend upon the method chosen to form the trenches, as well as the method or methods used to reopen the trenches from the frontside and backside of the substrate later in the device manufacturing process. For example, if the technique used to form trenches 20 is one that forms trenches with high aspect ratios, then the trenches may be made to extend substantially through the substrate, as shown in FIG. 2. This is because trenches with a high aspect ratio have steeper sides and narrower openings than low aspect ratio trenches of a similar depth. These trenches thus may use less space on the substrate frontside, and also may be easier to seal than trenches with a wider opening. Etching techniques suitable for forming high aspect ratio trenches in a silicon substrate include dry etching techniques, such as deep reactive ion etching (DRIE), and also may include some wet etching techniques, such as the technique described in U.S. Pat. No. 5,997,713 to Beetz, Jr., et al.

On the other hand, if an etching technique that yields trenches 22 with significantly sloped sides is used, then the trenches may be formed to a lesser depth, and then a more directionally selective etching technique may be used to open the trenches from the substrate backside.

Figure 3:
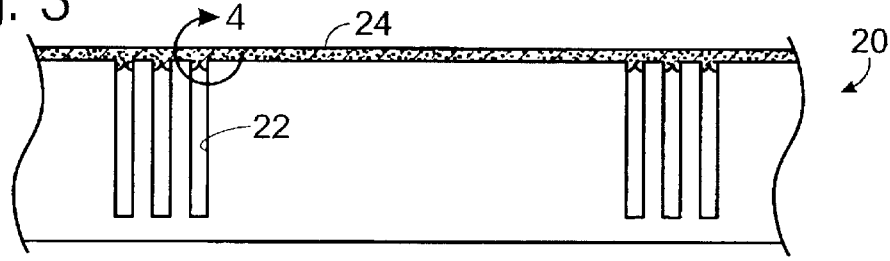
FIG. 3 is a sectional view of the substrate of FIG. 2, after sealing the plurality of trenches.

Referring next to FIG. 3, after forming trenches 22 in substrate 20, the trenches are sealed with a sealing layer 24 to prevent materials from later processing steps from contaminating the interiors of the trenches. Any suitable material may be used for sealing layer 24. Suitable materials include those that are able to withstand the temperatures and other processing conditions of downstream processing steps. Examples of suitable materials include, but are not limited to, silicon oxide, silicon nitride, silicon oxynitride and aluminum oxide.

Figure 4:
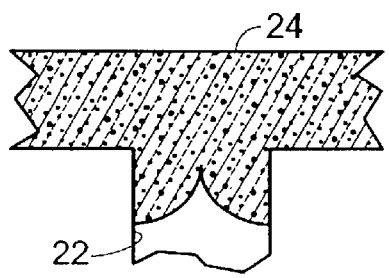
FIG. 4 is a magnified view taken from the area defined by curve 4 of FIG. 3.

Sealing layer 24 may be formed via any suitable techniques. Where silicon dioxide is used as sealing layer 24, for example, the sealing layer may be formed by RF sputtering. Films formed by RF sputtering tend to have poor step coverage. Thus, the silicon dioxide film may grow more rapidly at the opening of trenches 22 than at the bottom of the trenches, and thus may seal the trenches without substantially filling them. This is shown in FIG. 4 in more detail. Additionally, the surface of sealing layer 24 may be leveled or planarized using a technique such as chemical-mechanical polishing to improve the surface for downstream processing steps.

Typically, trenches 22 are sealed in a medium or high vacuum environment. For example, where RF sputtering is used to form sealing layer 24, the trenches are sealed in a medium vacuum environment, and thus contain sputtering gases at a medium vacuum pressure within their interiors. Sealing trenches in a medium or high vacuum environment may help to prevent the trenches from being ruptured by increases in gas pressure in the interiors of the trenches caused by later high temperature processing steps. When sealed in an RF sputtering environment, trenches 22 typically contain on the order of 50–500 millitorr of argon, though they may also contain other gases, such as oxygen, and may also have a pressure outside of this range.

After sealing trenches 22 with sealing layer 24, a circuit element may be formed on the frontside of substrate 20 via ordinary processing techniques. An exemplary circuit element is shown generally at 30 in FIG. 5. In one embodiment, circuit element 30 includes a resistor structure 32 connected to a conductor 34. Additionally, two insulating layers 36 are disposed between sealing layer 24, resistor structure 32 and conductor 34 to electrically insulate the resistor structure and conductor from other circuit elements on substrate 20. It will be appreciated that circuit element 30 is shown for purposes of example only, and that any desired circuit element may be formed in substrate 20 without departing from the scope of the present invention. Examples of the wide variety of circuit elements that may be formed for use with a through-substrate interconnect according to the present invention include, but are not limited to, actuating electromechanical or micro-mechanical devices located on the frontside of the substrate.

Figure 5:
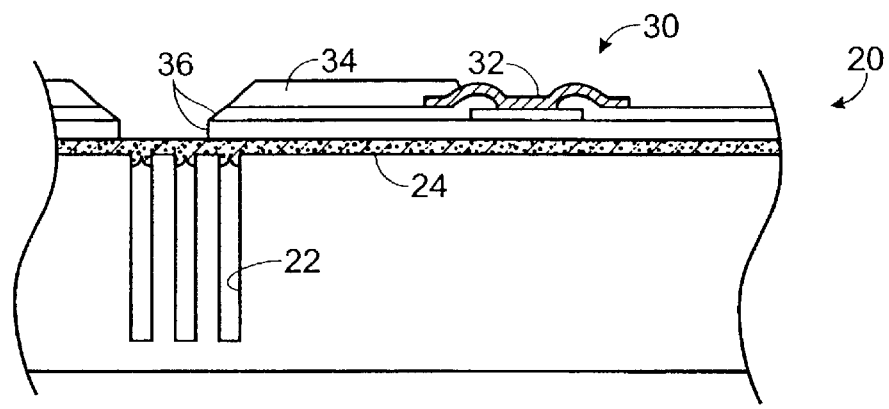
FIG. 5 is a sectional view of the substrate of FIG. 2, after a circuit element has been formed on the frontside of the substrate.

Circuit element 30 is positioned on substrate 20 such that at least some of trenches 22 are left uncovered by the circuit element in this embodiment. In FIG. 5, for example, two trenches 22 are left uncovered by circuit element 30. This allows these two trenches 22 to be reopened from the substrate frontside to be used to form an interconnect.

Figure 6:
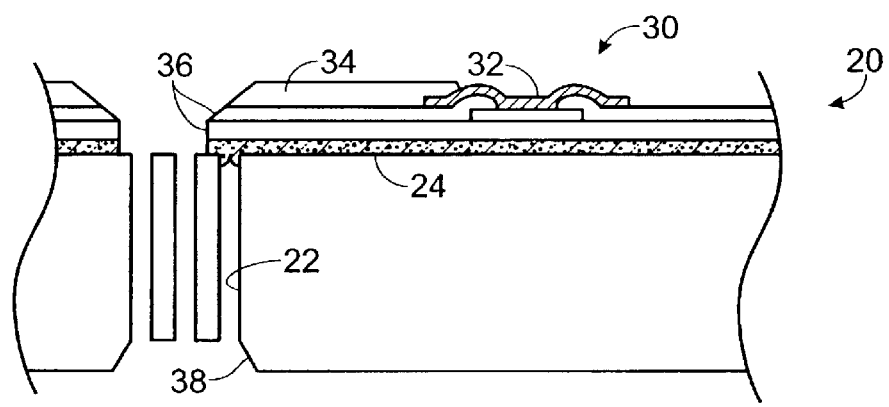
FIG. 6 is a sectional view of the substrate of FIG. 2 after some of the plurality of trenches have been opened from the frontside and backside of the substrate.

Next, trenches 22 are opened at the substrate backside by the formation of a second interconnect structure in the form of an etched region 38, as shown in FIG. 6. It will be appreciated that as many or as few trenches 22 as desired may be opened for use as a through-substrate interconnect. The opening of a greater number of trenches 22 may allow a larger volume of conductor to be deposited in the vias, and thus may allow a greater amount of electrical current to be delivered to circuit element 30. Furthermore, the opening of more trenches may allow a greater total amount of conductor to be deposited in the vias per unit time, and thus may make the overall manufacturing process more efficient.

Trenches 22 may be opened from the frontside and backside in any suitable manner. Typically, the tops and bottoms of trenches 22 are opened by wet or dry etching to remove material of layer 24 and substrate 20, respectively. Because trenches 22 are typically opened near the end of the device manufacturing process, it may be preferable to use an etching method that does not involve high temperatures to avoid causing unwanted diffusion.

Once trenches 22 have been opened up from the bottom and the top, the through-substrate interconnect may be completed by depositing an electrically conductive material into the trenches (not shown, but discussed in more detail below in the context of other embodiments) such that the material contacts conductor 34. For example, before the electrically conductive material is deposited into trenches 22, the sides of the trenches may be passivated with an insulating material, such as silicon nitride, silicon dioxide, silicon oxynitride, tantalum oxide and aluminum oxide, to prevent current from the through-substrate interconnect from leaking into the substrate bulk. The passivating layer may be deposited by any suitable method. Examples of suitable methods include atomic layer deposition, cathode anodization, cathode nitridization, and combinations of these methods. These methods are discussed in more detail below in the context of other embodiments.

After the insulating material has been deposited on the sides of trenches 22, the electrically conductive material may be deposited in the trenches (not shown, but discussed in more detail below in the context of other embodiments). Any suitable electrically conductive material may be used, for example, copper, aluminum or gold. Similarly, the electrically conductive material may be deposited into trenches 22 via any suitable technique. Examples of suitable techniques include electroplating and atomic layer deposition (ALD). If electroplating is used, a seed layer is typically deposited on the passivating layer to carry the current for the electroplating process. This seed layer may be deposited by any suitable method, for example, by physical vapor deposition (PVD) or ALD.

A contact pad for connecting the interconnect to the device package is typically formed on the backside of substrate 20 (not shown, but discussed in more detail below in the context of other embodiments). The contact may be formed at the same time as the conductive material is deposited into trenches 22, or may be formed in a separate step. Examples of suitable methods for the formation of the passivating layer, seed layer and contact pads are described in more detail below for other implementations of method 10.

Figure 7:
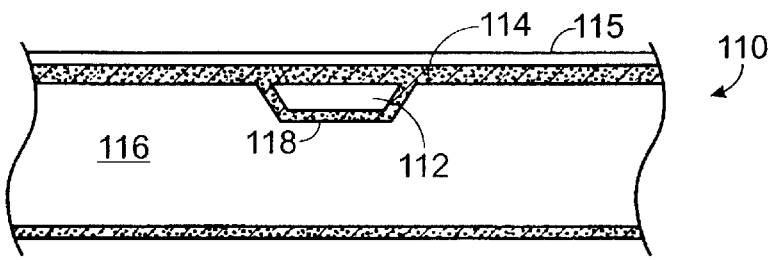
FIG. 7 is a sectional view of a substrate suitable for use with a second implementation of the embodiment of FIG. 1, after forming a polysilicon well structure in the substrate frontside.

FIGS. 7–19 illustrate a second implementation of method 10. Referring first to FIG. 7, this implementation of method 10 begins with a substrate 110 having a polysilicon well structure 112 formed in the frontside 114 of the substrate. Polysilicon well structure 112 is separated from the substrate bulk 116 by an insulating layer 118, typically silicon oxide or silicon nitride. The polysilicon well structure 112 shown in FIG. 7 may be formed by first etching the well shape into the substrate, forming insulating layer 118 over the substrate surface, depositing polysilicon into the well, and then removing the polysilicon from areas outside the well, for example by etching and/or chemical mechanical polishing. After forming polysilicon well structure 118, ordinary "front end," or high temperature, processing steps may be used to deposit other layers onto the surface of the substrate to at least partially form a circuit element. These other layers are indicated generically by layer 115.

Figure 8:
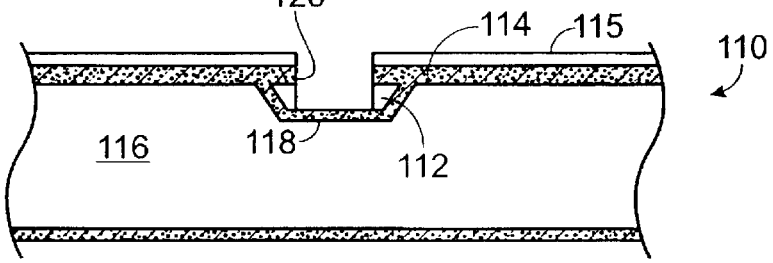
FIG. 8 is a sectional view of the substrate of FIG. 7, after forming a first trench in the substrate from the frontside of the substrate.
Figure 9:
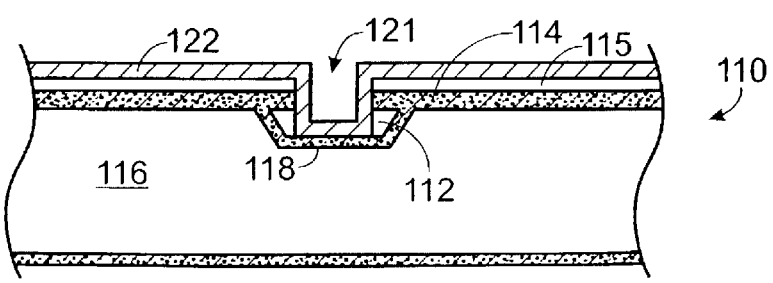
FIG. 9 is a sectional view of the substrate of FIG. 7, after depositing an electrically conductive material in the first trench.
Figure 10:
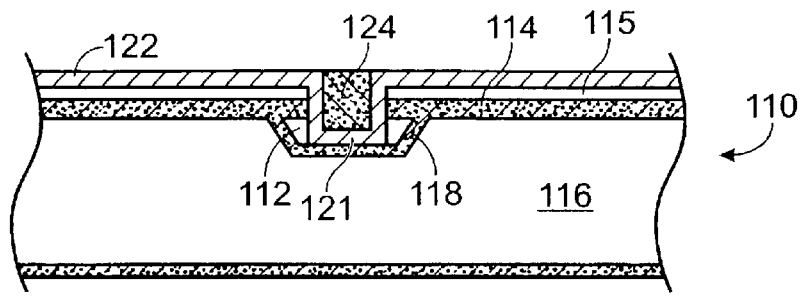
FIG. 10 is a sectional view of the substrate of FIG. 7, after filling the first trench with a planarizing material.

After forming polysilicon well structure 112, a trench 120 is etched, or otherwise formed, in the polysilicon well structure down to insulating layer 118, as shown in FIG. 8. Next, a layer of an electrically conductive material 122 is deposited in trench 120, as shown in FIG. 9. The resulting structure, indicated generally at 121, corresponds to the first interconnect structure of method 10. Appropriate masks may be used to prevent etching in undesired areas on substrate frontside 114.

Any suitable etching process may be used to form trench 120. Typically, a dry etching process, or other etching process that may be used to produce a trench with a high aspect ratio, is used to form trench 120. The use of polysilicon well structure 112 and insulating layer 118 may help to simplify the etching process. One potential problem with various etching processes (or other material removal processes, such as laser ablation) is that it is difficult to stop the etching process reproducibly at a precise depth. However, the use of polysilicon well structure 112 and insulating layer 118 allows a chemically selective process that etches polysilicon to the relative exclusion of silicon dioxide or other insulating materials to be used. In this manner, the process of etching trench 120 to a desired depth may be easily and reproducibly performed.

As described above, after etching trench 120, layer of electrically conductive material 122 is deposited in the trench to define first interconnect structure 121. Examples of suitable materials include, but are not limited to, copper and aluminum. Layer of electrically conductive material 122 may be formed of any material with a suitable electrical conductivity. Waiting to deposit layer of electrically conductive material 122 until after the completion of high temperature processing steps typically performed early in device manufacturing processes allows metals such as copper and aluminum to be used to form first interconnect structure 121 without any danger of harming layer 122 by later processing steps, which are typically performed at lower temperatures. If it is desired to form first interconnect structure at an earlier processing point, then a refractory conductor, for example, tungsten or a metal silicide, may be used for first interconnect structure. This is because tungsten or a metal suicide may withstand higher temperature processing steps.

Layer of electrically conductive material 122 may be deposited or otherwise formed by any suitable method. Examples of suitable methods include, but are not limited to, sputtering, chemical vapor deposition and atomic layer deposition.

The interior of trench 120 may either be filled completely with an electrically conductive material, or may be filled only partially with the electrically conductive material, as shown in the embodiment of FIG. 9. Where trench 120 is only partially filled with the electrically conductive material, the remaining portion of the interior of the trench may be filled with a layer of an insulating material 124.

Layer of insulating material 124 isolates layer of electrically conducting material 122 from other electrically conducting layers that may be deposited over top of layer of electrically conducting material 122 in later processing steps. Furthermore, layer of insulating material 124 may be planarized by etching and/or chemical-mechanical polishing to produce a smooth, level surface for later processing steps. Any suitable insulating material may be used for layer of insulating material 124, and the insulating material may be deposited or otherwise formed in any suitable manner. Examples of suitable insulating materials include, but are not limited to, silicon dioxide and silicon nitride. It will be appreciated that, where trench 120 is entirely filled with an electrically conductive material, an insulating layer may still be formed on the top surface of the electrically conductive material to insulate the electrically conductive material from other electrically conductive layers formed in later processing steps.

After forming layer of insulating material 124, other layers, indicated generically by layer 125, may be formed on the frontside of the substrate as desired to form a circuit element (not shown). Once the circuit element has been at least partially formed, a second interconnect structure may be formed from the substrate backside to connect with first interconnect structure 121 and form the through-substrate interconnect. Typically, the second interconnect structure is formed by first forming a trench in the backside of the substrate to expose layer of electrically conductive material 122, and then filling or coating the interior of the backside trench with an electrically conductive material.

Figure 11:
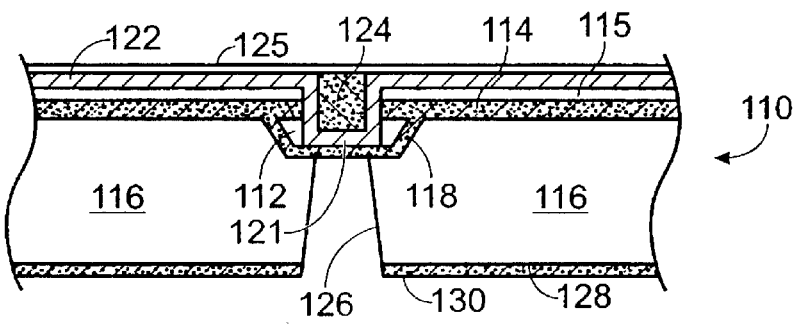
FIG. 11 is a sectional view of the substrate of FIG. 7, after forming a second trench in the substrate from the backside of the substrate.

FIGS. 10–18 illustrate one method of forming the second interconnect structure. First, a trench 126 is formed in substrate 110 from the backside 128 of the substrate such that the trench extends from the backside of the substrate to layer of electrically conductive material 122, as shown in the embodiment of FIG. 11. Trench 126 may be formed via a wet etch process, a dry etch process, laser ablation, or any other suitable process. Because trench 126 is typically formed at a relatively late processing stage, it may be formed utilizing a low-temperature etching technique to avoid degrading any temperature-sensitive layers deposited in earlier processing steps.

Furthermore, a chemically selective etching technique that etches substrate bulk 116 selectively over layer of electrically conductive material 122 may be used to stop the etching upon the reaching layer of electrically conductive material. This may allow the etching process to be controlled without the need for extremely close monitoring of etching rates. Depending upon the etch chemistry selected and the materials that comprise substrate bulk 116 and layer of insulating material 118, a separate etching process may be used to etch through the substrate bulk and the layer of insulating material. Furthermore, substrate 110 may have a thin insulating layer 130 formed on the substrate backside, which also may be etched with a different etching chemistry. Finally, a masking typically may be used to mask portions of substrate 110 that are to be protected during the backside etching process or processes.

Figure 12:
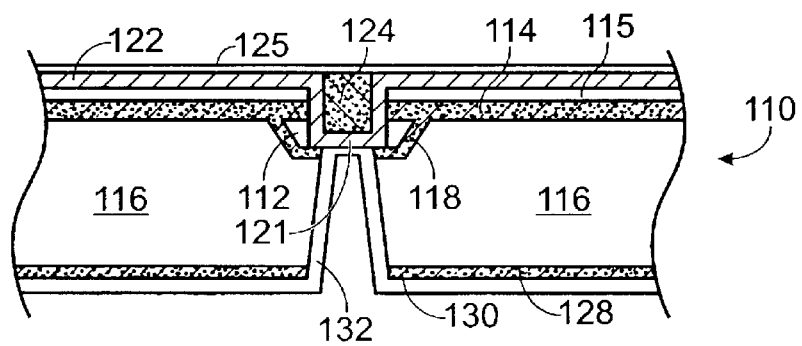
FIG. 12 is a sectional view of the substrate of FIG. 7, after forming a passivating layer in the second trench and on the backside of the substrate.

After trench 126 has been formed in substrate backside 128, a passivating layer 132 may be formed on the sides of the trench and on the substrate backside, as shown in FIG. 12. Passivating layer 132 is configured to electrically insulate conductive material deposited in trench 126 from substrate bulk 116. Passivating layer 132 may be formed by any suitable methods, including, but not limited to, plasma anodization, plasma nitridization, a combination of plasma anodization and plasma nitridization, and atomic layer deposition. Where plasma anodization and/or plasma nitridization are used, the passivating layer is typically formed of silicon oxide and/or silicon nitride. Atomic layer deposition allows passivating layer 132 to be formed from a wider variety of materials, and thus may allow a passivating material to be selected for particular physical properties, such as its dielectric constant. Examples of materials that may be deposited using atomic layer deposition include, but are not limited to, tantalum oxide and aluminum oxide.

Atomic layer deposition results in the formation of extremely uniform and dense films, which may allow the use of a very thin passivating layer 132. For example, passivating layer 132 typically is subjected to an electrical potential of approximately forty volts during ordinary use. Atomic layer deposition allows films with a breakdown field of up to ten angstroms/volt to be formed, and thus may allow the use of a passivating layer with a thickness on the order of four hundred angstroms.

Figure 13:
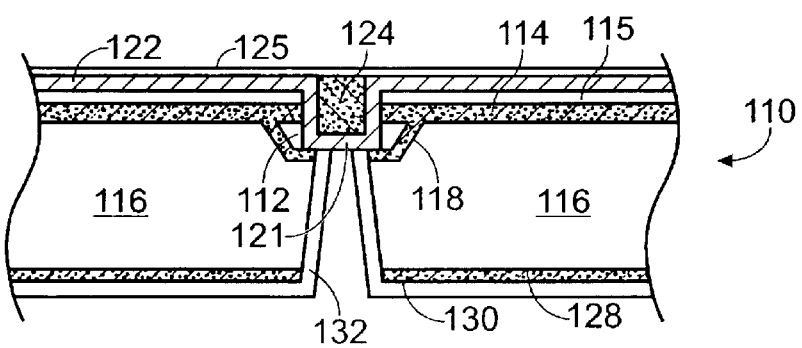
FIG. 13 is a sectional view of the substrate of FIG. 7, after removing the passivating layer from the bottom of the second trench.
Figure 14:
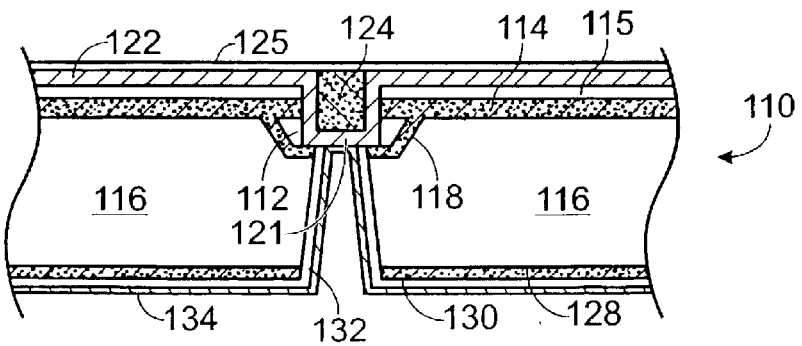
FIG. 14 is a sectional view of the substrate of FIG. 7, after forming an adhesion layer in the second trench and on the backside of the substrate.
Figure 15:
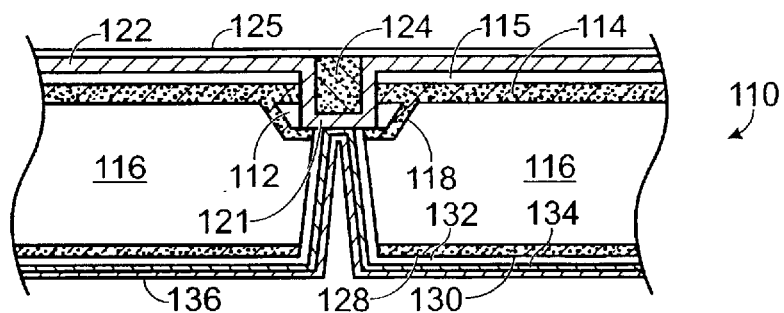
FIG. 15 is a sectional view of the substrate of FIG. 7, after forming a seed layer in the second trench and on the backside of the substrate.

Depending upon the process used to form passivating layer 132, the passivating layer may need to be removed from the bottom of trench 126 before an electrically conductive material is deposited in the trench. For example, where plasma anodization is used to create passivating layer 132, the process may not oxidize layer of electrically conducting material 122 at the bottom of trench 126 as rapidly as the sides of the trench, if at all. In this situation, passivating layer 132 may not need to be removed from the bottom of trench 126. However, other methods of forming passivating layer 132 may cause a sufficiently thick passivating layer to form at the bottom of trench 126 to require its removal from the bottom of the trench, as shown in FIG. 13. In this situation, passivating layer 132 may be removed from the bottom of trench via any suitable method. For example, a directional etch that selectively removes material oriented in the direction of the bottom of trench 126 to the relative exclusion of material oriented in the directions of the sides of the trench may be used. Alternatively, where passivating layer 132 is thinner at the bottom of trench 126 than on the sides of the trench, a non-directional etch may be used.

After removing passivating layer 132 from the bottom of trench 126 (where desired), any other desired steps to ready substrate 110 for the deposition of an electrically conductive material in trench 126 may be performed. This preparation may involve several steps, depending upon the method used to deposit the electrically conductive material in trench 126. For example, an adhesion layer, indicated at 134 in FIG. 14, may be used to improve the adherence of the electrically conductive material to the walls of trench 126. Furthermore, where electroplating is used to deposit the electrically conductive material, a seed layer, indicated at 136 in FIG. 15, may be used to carry current for the electrodeposition process.

Any suitable material may be used for adhesion layer 134. Examples of suitable materials include those that adhere well both to seed layer 136 and to passivating layer 132. Where passivating layer 132 is formed from silicon oxide, suitable materials for adhesion layer 134 include, but are not limited to, tantalum and titanium. Likewise, adhesion layer 134 may be formed by any suitable method, examples of which include but are not limited to atomic layer deposition, dual collimated physical vapor deposition (or other PVD techniques) and sputtering.

Seed layer 136 may also be made of any suitable material. Suitable materials include those that have the ability to carry a sufficient current for the electroplating process. Examples include, but are not limited to, copper and gold. If desired, seed layer 136 may be formed from the same material that is to be electroplated. Thus, where copper is to be deposited by electroplating, copper may also be used to form seed layer 136. Suitable methods of depositing seed layer 136 include, but are not limited to, atomic layer deposition, dual collimated physical vapor deposition (and other PVD techniques), self-ionized plasma (SIP), and sputtering.

Although FIGS. 7–19 show only a single trench 126 formed in the backside of substrate 110, a typical substrate will have more than one trench 126 formed in its backside, and may have a very large number of trenches 126, depending upon how many through-substrate interconnects are to be formed. Thus, to allow current to flow across the entire backside of substrate 110 to assist in the electroplating process, adhesion layer 134 and seed layer 136 are deposited on backside 128 of substrate 110, as well as on the interior surfaces of trench 126.

Figure 16:
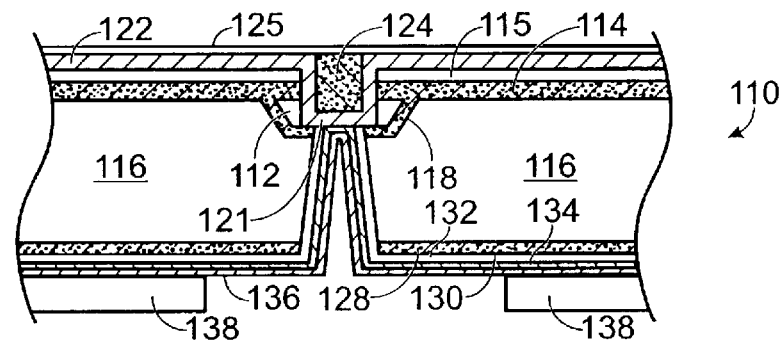
FIG. 16 is a sectional view of the substrate of FIG. 7, after depositing and patterning a layer of photoresist on the backside of the substrate.
Figure 17:
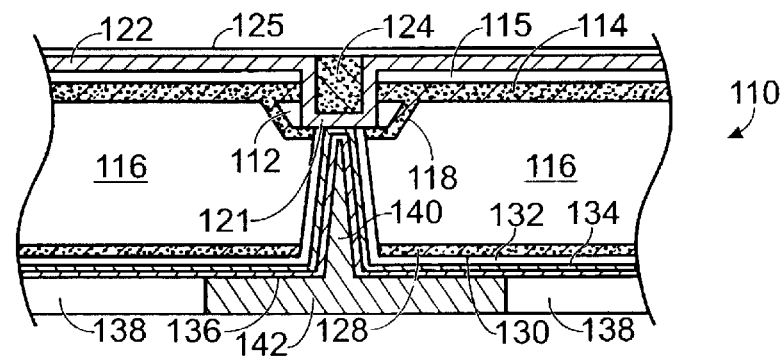
FIG. 17 is a sectional view of the substrate of FIG. 7, after electroplating an electrically conductive material in the second trench and on the backside of the substrate to form a contact pad.
Figure 18:
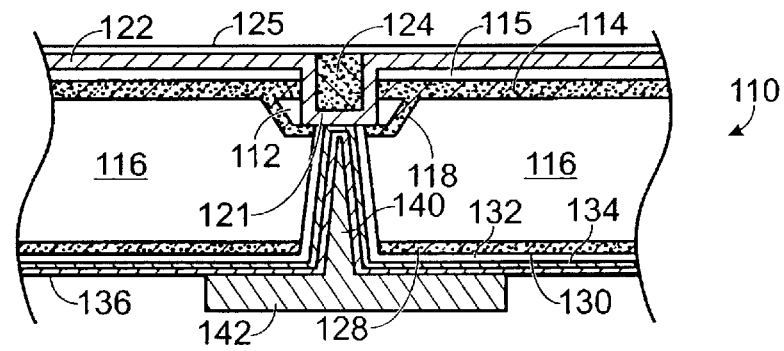
FIG. 18 is a sectional view of the substrate of FIG. 7, after stripping the photo resist.
Figure 19:
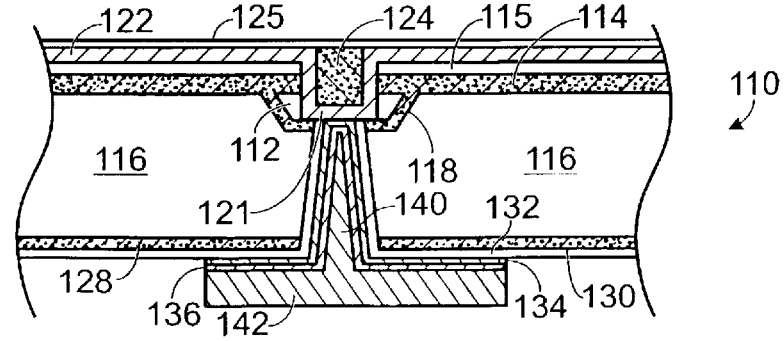
FIG. 19 is a sectional view of the substrate of FIG. 7, after etching the electrically conductive material from the spaces adjacent the contact pad.

A contact pad may be formed on backside of substrate 110 to allow the through-substrate interconnect to be connected to external circuitry. If desired, the contact pad may be formed in the same processing step as the electroplating of the interior of trench 126. First, a layer of photoresist, shown at 138 in FIG. 16, is deposited and patterned to define the areas of substrate 110 that are to be electroplated. Next, a layer of an electrically conductive material is deposited to fill the interior of trench 126 to form the second interconnect structure, indicated generally at 140 in FIG. 17. The electrically conductive material is also deposited on the surfaces of backside 128 of substrate 110 that are left unprotected by photoresist. After forming second interconnect structure 140, layer of photoresist 138 is stripped, leaving a contact pad 142 defined on backside 128 of substrate 110, as shown in FIGS. 17 and 18. Finally, the portions of seed layer 136 and adhesion layer 134 that are positioned on the substrate backside adjacent contact pad 142 are etched away to electrically isolate contact pad 142 from other contact pads, as shown in FIG. 19. At this point, second interconnect structure 140 and first interconnect structure 121 define an electrically conductive path through substrate bulk 116, and connect contact pad 142 to any circuit elements connected to layer of electrically conductive material 122.

Alternatively, second interconnect structure 140 may be formed after removing passivating layer 132 from the bottom of trench 126 (FIG. 13) by passing an through first interconnect structure 121. In this manner, second interconnect structure 140 grows from the bottom of trench 126 toward the bottom of the substrate, eventually completely filling the trench. If desired, an adhesion layer may be used to improve the adhesion of second interconnect structure 140 to the sides of the substrate. This method may also be used to form multiple second interconnect structures 140 at the same time by blanketing the entire substrate frontside with the electrically conductive material, then electrodepositing the electrically conductive material in a plurality of trenches 126 formed in the substrate, and then patterning the electrically conductive material on the substrate frontside to electrically isolate adjacent interconnects from one another.

Figure 20:
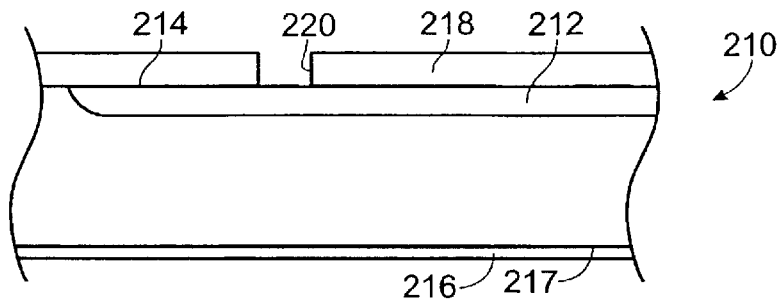
FIG. 20 is a sectional view of a substrate after etching a first portion of a first trench from the frontside of the substrate in accordance with a third implementation of the embodiment of FIG. 1.

FIGS. 20–28 illustrate a third implementation of method 10. First, FIG. 20 shows a substrate 210 to which some initial processing steps have been performed. Substrate 210 includes various structures created by the initial processing steps, such as a doped region 212 formed in the substrate below the frontside 214 of the substrate, and a protective layer 216, typically an oxide layer, formed on backside 217 of the substrate. FIG. 20 also shows a first insulating layer 218, formed on frontside 214 of substrate 210. Insulating layers such as first insulating layer 218 may be formed on substrate 210 for many reasons, for example, to insulate a conductive layer (not shown) formed at another location on the substrate.

As depicted in FIG. 20, a trench 220 has been etched through first insulating layer. Trench 220 forms a first portion of the first interconnect structure of method 10. Trench 220 may be formed in any suitable manner. For example, a chemically selective etch that etches the material of first insulating layer 218 to the exclusion of substrate 210 may be used to avoid problems with stopping the etching process at the correct depth. However, any of the other methods described for other implementations of method 10 may also be used.

Figure 21:
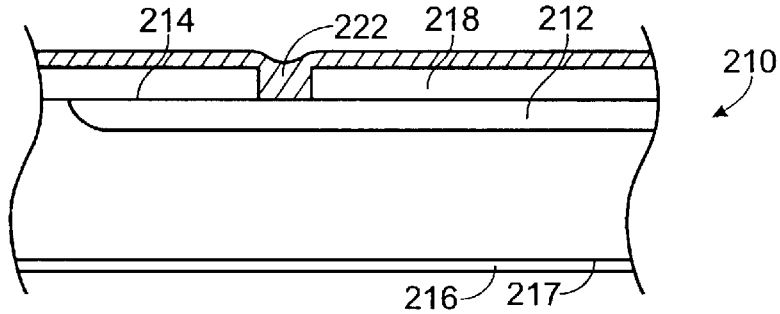
FIG. 21 is a sectional view of the substrate of FIG. 20, after depositing an electrically conductive material in the first portion of the first trench and on the frontside of the substrate.
Figure 22:
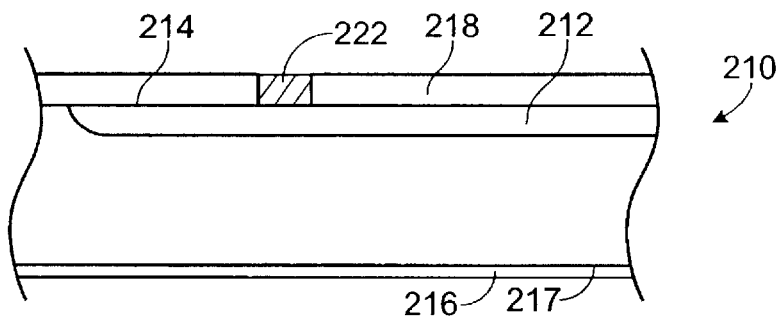
FIG. 22 is a sectional view of the substrate of FIG. 20, after removing the electrically conductive material from the frontside of the substrate.
Figure 23:
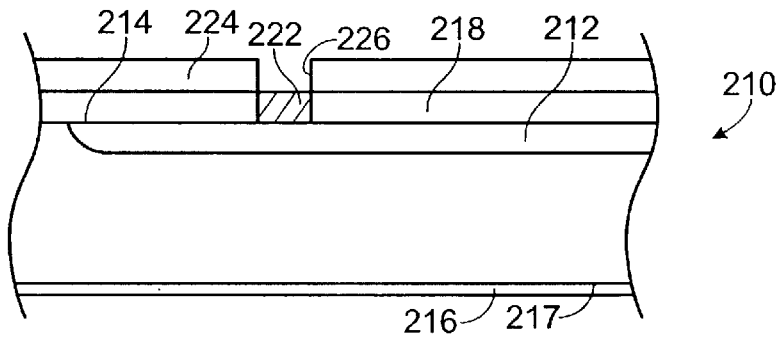
FIG. 23 is a sectional view of the substrate of FIG. 20, after forming a new layer of material on the frontside of the substrate and then forming a second portion of the first trench through the new layer of material.
Figure 24:
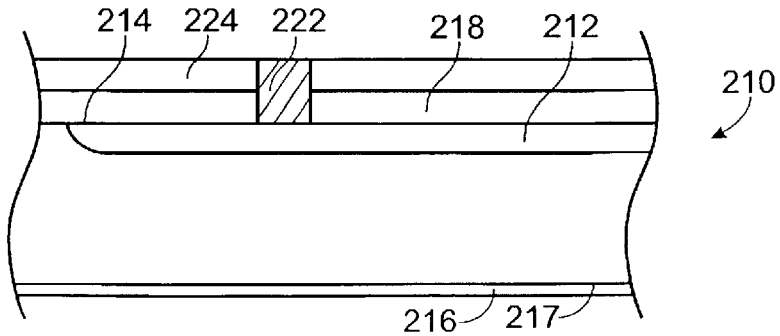
FIG. 24 is a sectional view of the substrate of FIG. 20, after depositing an electrically conductive material in the second portion of the first trench.

After forming trench 220, the trench is filled with an electrically conductive material, indicated as layer 222 in FIG. 21. Layer of electrically conductive material 222 may be formed in any suitable manner. For example, layer of electrically conductive material 222 may be deposited uniformly across substrate frontside 214 to a sufficient depth to fill trench 220, and then partially removed by any suitable method such that the electrically conductive material remains only in the trench, as shown in FIG. 22. The use of chemical-mechanical polishing to remove excess conductive material offers the advantage of leaving a smooth, level surface for further processing steps, although other suitable methods of removing excess conductive material may also be used.

After removing excess electrically conductive material, a second layer of material 224 is deposited onto first oxide layer 218 and electrically conductive layer 222. Second layer of material 224 may be any desired material for the formation of any desired circuit structures.

Once second layer of material 224 has been formed, a trench 226 is formed in the second insulating layer over trench 220. Trench 226 is typically formed via an etching process that selectively etches the material of the second insulating layer to the exclusion of the material of electrically conductive layer 222, although any other suitable process may be used. After forming trench 226, the trench may be filled with a layer of an electrically conductive material, and excess electrically conductive material may be removed via chemical-mechanical polishing. These steps form a second portion of the first interconnect structure extending through second insulating layer 224. The steps of forming a trench and filling the trench with an electrically conductive material may be repeated for each additional layer of material, indicated generically at 225, that is formed on the substrate frontside, as illustrated in FIG. 25. The completed first interconnect structure is shown at 229 in FIG. 25. It will be appreciated that separate masking steps may be used to define the area to be etched for the formation of trenches 220 and 226.

Next, an electrical contact layer, indicated at 230 in FIG. 26, is formed. Electrical contact layer 230 extends at least partially over first interconnect structure 229, and connects the first interconnect structure to circuitry (not shown) formed elsewhere on substrate 210. Typically, other layers, indicated collectively at 232, are then formed over electrical contact layer 230 during the device manufacturing process. At the completion of the steps illustrated by FIGS. 20–26, electrical contact layer 230 and first interconnect structure 229 are sandwiched between substrate 210 and other layers 232.

Next, the second interconnect structure is formed from backside 217 of substrate 210. The formation of the second interconnect structure is illustrated generally in FIGS. 27–28. First, referring to FIG. 27, a trench 234 that meets first interconnect structure 229 is formed in backside 217 of substrate 210. Trench 234 may be formed in any suitable manner, for example, via wet or dry etching, or by laser ablation. As with the other implementations described above, an etching technique that selectively etches substrate bulk 236 to the exclusion of the electrically conductive material of first interconnect structure 229 may be employed so that the etch substantially stops upon reaching the first interconnect structure. If it is desired to form trench 234 with relatively straight sides, as depicted in FIG. 27, then a dry etching technique may be used. Alternatively, if it is desired to form trench 234 with more sloped sides, then a wet etching technique may be used. Furthermore, a step may be formed in the sides of trench 234 by using two (or more) separate masking steps when etching the trench.

After forming trench 234, an electrically conductive material may be deposited in the trench to form the second interconnect structure, indicated generally at 238 in FIG. 28. Furthermore, a contact pad 240 may be formed on backside 217 of substrate 210 to allow circuit elements formed on substrate 10 to be electrically connected to external circuitry. As described above for other implementations of method 10, the deposition of the electrically conductive material in trench 234 may include several discrete steps. For example, a passivating layer may be formed on the sides of trench 234 to prevent current from leaking into substrate bulk 236. Also, an adhesion layer may be formed to prevent second interconnect structure 238 from separating from the sides of trench 234. Furthermore, a seed layer may be formed to carry current for the electrodeposition of the electrically conductive material to form second interconnect structure 238. In the completed structure, first interconnect structure 229 and second interconnect structure 238 define an electrically conductive path between contact pad 240 and electrical contact layer 230, allowing current from an off-substrate source to reach a circuit element that is connected to contact layer 230.

Figure 29:
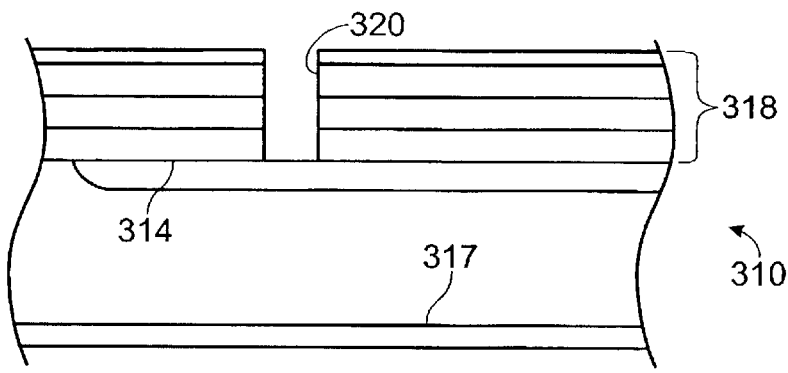
FIG. 29 is a sectional view of a substrate with a plurality of layers formed on the substrate, after forming a first trench through the plurality of layers according to a fourth implementation of the embodiment of FIG. 1.

In the implementation of FIGS. 20–28, first interconnect structure 229 is formed by iteratively depositing a new layer of material onto frontside 214 of substrate 210, then etching a trench in the new layer, and then filling the trench with an electrically conductive material to form first interconnect structure 229 in a layer-by-layer manner. FIGS. 29–32 show an alternative method of forming a first interconnect structure. Referring first to FIG. 29, trench 320, which is later filled with an electrically conductive material to form the first interconnect structure, is not formed until all underlying layers 318 up to the electrical contact layer have been formed on substrate 310. Trench 320 may be formed by any of the techniques described above for the other implementations of method 10. It will be appreciated that, where an etching process is used to create trench 320, the etching chemistry may need to be changed to etch through different underlying layers 318, depending upon the chemical makeup, crystalline orientation, and other physical properties of each underlying layer. However, trench 320 may be formed via a single masking step, which may increase the efficiency of the process.

Figure 30:
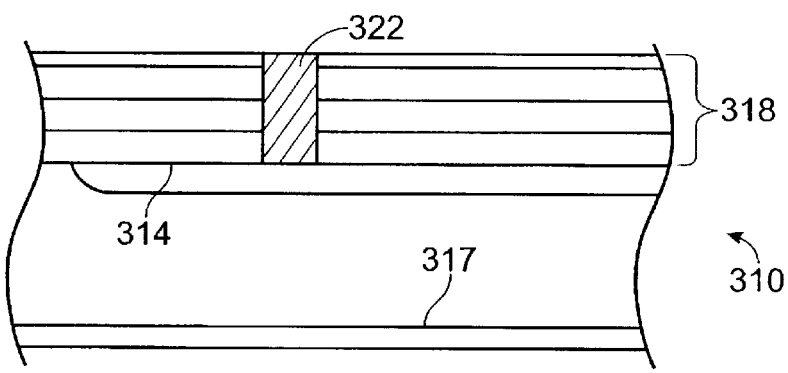
FIG. 30 is a sectional view of the substrate of FIG. 29, after depositing an electrically conductive material in the first trench.
Figure 31:
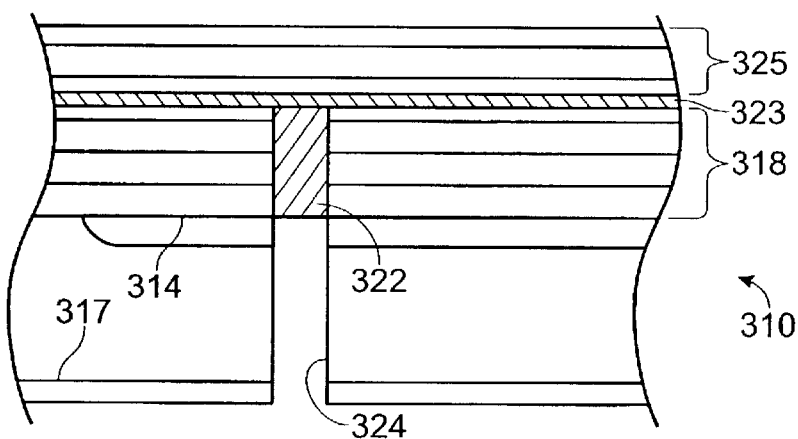
FIG. 31 is a sectional view of the substrate of FIG. 29, after forming a second trench in the substrate from the backside of the substrate.
Figure 32:
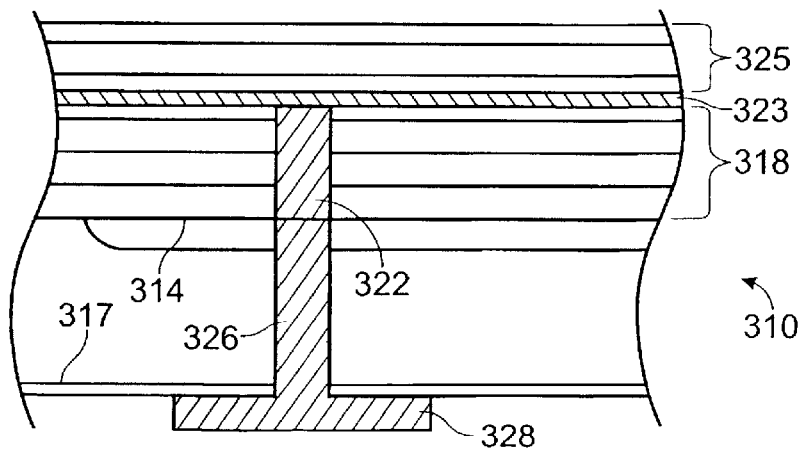
FIG. 32 is a sectional view of the substrate of FIG. 29, after depositing an electrically conductive material in the second trench.

After forming trench 320, the trench is filled with an electrically conductive material to form a first interconnect structure, shown at 322 in FIG. 30, a contact layer 323 is formed over the first interconnect structure, and then other layers, indicated generically at 325, are formed on top of the contact layer during later processing steps. Next, a trench 324 is formed in the backside of substrate 310, as shown in FIG. 31, and filled with an electrically conductive material to form a second interconnect structure 326, as shown in FIG. 32. Each of these steps may be performed as described above for the implementation of FIGS. 20–28, other implementations described herein, or in any other suitable manner. Finally, a contact pad 328 may be formed on backside 317 of substrate 310 for connecting to external circuitry.

Figure 33:
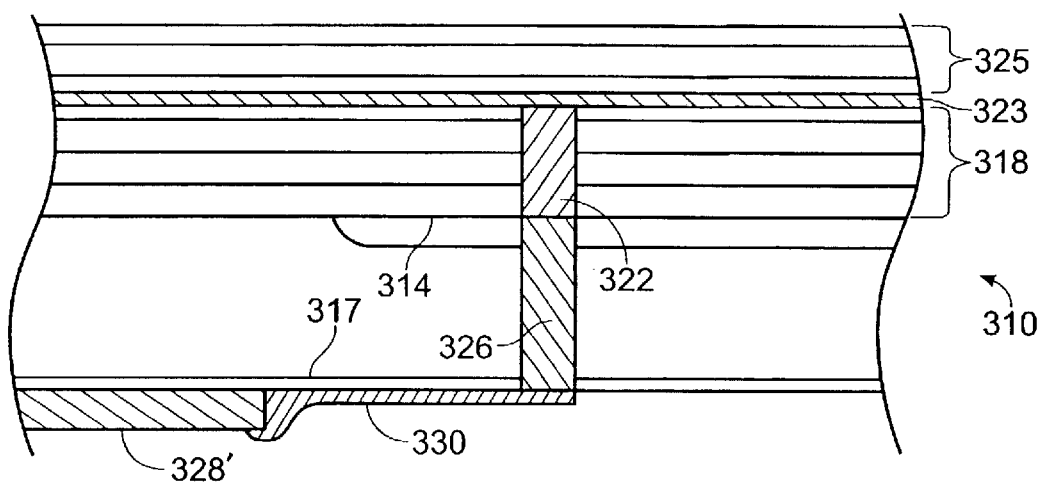
FIG. 33 is a sectional view of the substrate of FIG. 29, showing an alternate contact pad placement.

While contact pad 328 and second interconnect structure 326, as well as the contact pads and second interconnect structure of the other implementations described above, are depicted as integral with one another, it will be appreciated that the contact pad may also be formed at a location on substrate backsidespaced from the terminus of the second interconnect structure. This is shown in FIG. 33 at 328'. In this configuration, a conductive trace 330 may be formed on substrate backside 317 to connect second interconnect structure 326 to contact pad 328'. This allows contact pad 328' to be formed in any desired location on substrate backside 317, and thus permits a great deal of freedom in the placement of the contact pads on the substrate backside.

Figure 34:
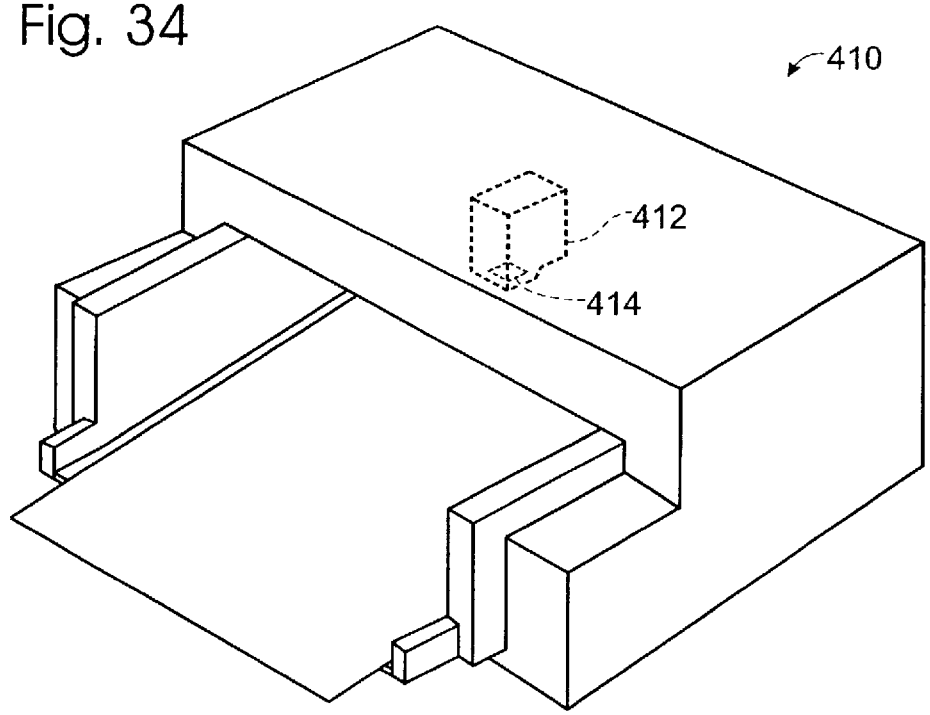
FIG. 34 is an isometric view of a printing device having a print cartridge with a printhead according to another aspect of the present invention.

A through-substrate interconnect constructed in accordance with the methods of the present invention may find uses in any of a number of different types of electronic devices. For example, mass storage devices and solid state memory devices may be constructed via methods according to the present invention. Other examples include detector or emitter arrays, micro-mechanical devices, optical switches, and printheads for printing devices. An exemplary printing device is shown generally at 410 in FIG. 34, and a printhead is indicated schematically at 412. While printing device 410 is depicted as a desktop printer, it will be appreciated that a printhead constructed in accordance with the present invention may also be used in any other printing device, such as a fax machine or a copier. Furthermore, printing device 410 may be any desired size, large- or small-format.

Printhead 412 includes a substrate 414 on which a plurality of ink ejection devices are formed. The ink ejection devices are configured to eject ink onto a medium positioned beneath the printhead. As described above, the interconnects connecting the ink ejection devices to external circuitry on conventional printheads typically are formed on the frontside of the substrate. Thus, the interconnects may be exposed to printing inks that may degrade the interconnects over time. In contrast, because the interconnects of substrate 414 extend through the substrate to contact pads formed on the back of the substrate, the interconnects are not exposed to inks, and thus may have a longer lifetime.

The disclosure set forth above encompasses multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious and directed to one of the inventions. These claims may refer to "an" element or "a first" element or the equivalent thereof; such claims should be understood to include incorporation of one or more such elements, neither requiring nor excluding two or more such elements. Inventions embodied in other combinations and subcombinations of features, functions, elements, and/or properties may be claimed through amendment of the present claims or through presentation of new claims in this or a related application. Such claims, whether directed to a different invention or to the same invention, and whether broader, narrower, equal, or different in scope to the original claims, also are regarded as included within the subject matter of the inventions of the present disclosure.

What is claimed is:

1. A method of forming a through-substrate interconnect for a microelectronics device, the device being formed on a substrate having a frontside and a backside, the device including a circuit element formed on the frontside of the substrate connected to a contact pad formed on the backside of the substrate by the through-substrate interconnect, the method comprising:

forming a first interconnect structure extending into the substrate from the frontside of the substrate, wherein forming the first interconnect structure includes forming a first trench extending into the substrate from the top surface of the substrate, and then sealing the first trench with a seal;

at least partially forming the circuit element, wherein the circuit element is in electrical communication with the first interconnect structure; and forming a second interconnect structure extending into the substrate from the backside of the substrate after forming the first interconnect structure, wherein the second interconnect structure is in electrical communication with the first interconnect structure and the contact pad.

2. The method of claim 1, wherein forming the first interconnect structure includes forming a plurality of trenches extending into the substrate from the top surface of the substrate, and then sealing each trench with a seal.

3. The method of claim 1, wherein the first trench is formed by a dry etch.

4. The method of claim 1, wherein the first trench is formed by laser ablation.

5. The method of claim 1, wherein the first trench is sealed by sputter deposition of silicon oxide.

6. The method of claim 1, wherein the first trench is substantially evacuated before sealing.

7. The method of claim 1, wherein forming the second interconnect structure includes forming a second trench extending into the substrate from the bottom surface of the substrate such that the second trench connects with the first trench.

8. The method of claim 7, further comprising depositing an electrically conductive material in the first trench and second trench.

9. A method of forming a through-substrate interconnect for a microelectronics device, the device being formed on a substrate having a frontside and a backside, the device including a circuit element formed on the frontside of the substrate connected to a contact pad formed on the backside of the substrate by the through-substrate interconnect, the method comprising:

forming a first interconnect structure extending into the substrate from the frontside of the substrate, wherein forming the first interconnect structure includes forming a polysilicon island structure adjacent the frontside of the substrate, and wherein the polysilicon island structure is separated from other portions of the substrate by an electrically insulating layer;

at least partially forming the circuit element, wherein the circuit element is in electrical communication with the first interconnect structure; and forming a second interconnect structure extending into the substrate from the backside of the substrate after forming the first interconnect structure, wherein the second interconnect structure is in electrical communication with the first interconnect structure and the contact pad.

10. The method of claim 9, wherein forming the first interconnect structure includes forming a first trench that extends through the polysilicon island structure from the frontside of the substrate to the electrically insulating layer.

11. The method of claim 10, wherein the first trench is formed by a chemically selective etching process that selectively etches the polysilicon to the substantial exclusion of the electrically insulating layer.

12. The method of claim 10, further comprising forming a layer of an electrically conductive material in the first trench.

13. The method of claim 12, further comprising substantially completely filling the first trench with an insulating material after forming the layer of the electrically conductive material in the first trench, and then etching the insulating material to create a substantially planar substrate surface for later processing steps.

14. The method of claim 12, wherein forming the second interconnect structure includes forming a second trench in the substrate extending from the backside of the substrate to the electrically conductive material deposited in the first trench.

15. The method of claim 14, wherein the second trench is formed by a dry etch.

16. The method of claim 14, the second trench having an interior surface, further comprising forming a passivating layer on the interior surface of the second trench.

17. The method of claim 16, wherein the passivating layer is formed from a material selected from the group consisting of aluminum oxide, silicon oxide, silicon nitride and silicon oxynitride.

18. The method of claim 16, wherein the passivating layer is formed by a method selected from the group consisting of atomic layer deposition, cathode anodization, cathode nitridization and combinations thereof.

19. The method of claim 14, further comprising forming an adhesion layer in the second trench.

20. The method of claim 19, wherein the adhesion layer is formed from a material selected from the group consisting of tantalum and titanium.

21. The method of claim 14, further comprising forming a seed layer on the passivating layer, wherein the seed layer is configured to facilitate the electroplating of the interior surface of the second trench.

22. The method of claim 21, further comprising electroplating an electrically conductive material onto the seed layer, wherein the electrically conductive material and the seed layer include the same material.

23. A method of forming a through-substrate interconnect for a microelectronics device, the device being formed on a substrate having a frontside and a backside, the device including a circuit element formed on the frontside of the substrate connected to a contact pad formed on the backside of the substrate by the through-substrate interconnect, the method comprising:
   forming a first interconnect structure extending into the substrate from the frontside of the substrate;
   at least partially forming the circuit element, wherein the circuit element is in electrical communication with the first interconnect structure; and
   forming a second interconnect structure extending into the substrate from the backside of the substrate after forming the first interconnect structure, wherein the second interconnect structure is in electrical communication with the first interconnect structure and the contact pad;
   wherein forming the first interconnect structure includes iteratively forming a new layer of material on the frontside of the substrate, forming a trench in the new layer of material, and then depositing an electrically conductive material in the trench such that the electrically conductive material in each trench contacts the electrically conductive material of the trenches of adjacent layers.

24. The method of claim 23, wherein forming the trench includes etching the trench by a chemically selective etching process that etches through the new layer of material to the substantial exclusion of the substrate.

25. A method of forming a through-substrate interconnect for a microelectronics device, the device being formed on a substrate having a frontside and a backside and including a circuit element formed adjacent the frontside of the substrate connected to a contact pad formed adjacent the backside of the substrate by the through-substrate interconnect, the method comprising:
   forming a first trench in the substrate from the frontside of the substrate, the first trench including an interior surface;
   depositing a first electrically conductive material in the first trench;
   substantially completely filling the first trench with an insulating material after depositing the first electrically conductive material in the first trench, and then planarizing the insulating material to form a planar surface for downstream processing steps;
   forming a second trench in the substrate from the backside of the substrate, the second trench including an interior surface, wherein the second trench exposes the conductive material in the first trench; and
   depositing a second electrically conductive material in the second trench.

26. A method of forming a through-substrate interconnect for a microelectronics device, the device being formed on a substrate having a frontside and a backside and including a circuit element formed adjacent the frontside of the substrate connected to a contact pad formed adjacent the backside of the substrate by the through-substrate interconnect, the method comprising:
   forming a first trench in the substrate from the frontside of the substrate, the first trench including an interior surface;
   depositing a first electrically conductive material in the first trench;
   forming a second trench in the substrate from the backside of the substrate, the second trench including an interior surface, wherein the second trench exposes the conductive material in the first trench;
   depositing a second electrically conductive material in the second trench; and forming a polysilicon well structure on the frontside of the substrate before forming the first trench in the substrate, wherein the polysilicon well structure is separated from other portions of the substrate by an insulating layer.

27. The method of claim 26, wherein the first trench is formed by etching through the polysilicon well structure to the insulating layer.

28. The method of claim 27, wherein the first trench is formed by a chemically selective etching process that is substantially slowed by the insulating material.

29. The method of claim 26, wherein the first electrically conductive material is selected from the group consisting of copper and aluminum.

30. The method of claim 26, wherein forming the second trench in the substrate includes etching to the insulating layer via a first etching method that substantially stops at the insulating layer, and then etching through the insulating layer via a second etching method to expose the first electrically conductive material in the first trench.

31. The method of claim 30, wherein the first etching method is a dry etching process.

32. A method of forming a through-substrate interconnect for a microelectronics device, the device being formed on a substrate having a frontside and a backside and Including a circuit element formed adjacent the frontside of the substrate connected to a contact pad formed adjacent the backside of the substrate by the through-substrate interconnect, the method comprising:

forming a first trench in the substrate from the frontside of the substrate, the first trench including an interior surface;

depositing a first electrically conductive material in the first trench;

forming a second trench in the substrate from the backside of the substrate, the second trench including an interior surface, wherein the second trench exposes the conductive material in the first trench; and depositing a second electrically conductive material in the second trench;

wherein forming the first trench and depositing a first electrically conductive material in the first trench include iteratively forming a new layer of material on the frontside of the substrate, forming a portion of the first trench in the new layer of material, and then depositing the first electrically conductive material in the portion of the first trench.

* * * * *

UNITED STATES PATENT AND TRADEMARK OFFICE
CERTIFICATE OF CORRECTION

PATENT NO. : 6,716,737 B2
DATED : April 6, 2004
INVENTOR(S) : Vander Plas et al.

It is certified that error appears in the above-identified patent and that said Letters Patent is hereby corrected as shown below:

<u>Title page,</u>
Item [12], delete "Plas et al." and insert in lieu thereof -- Vander Plas et al. --;

<u>Column 7,</u>
Line 44, delete "suicide" and insert in lieu thereof -- silicide --.

Signed and Sealed this

Twelfth Day of April, 2005

JON W. DUDAS
*Director of the United States Patent and Trademark Office*